(12) United States Patent
Kishino

(10) Patent No.: US 7,062,000 B1
(45) Date of Patent: Jun. 13, 2006

(54) VITERBI DECODER

(75) Inventor: Masahiko Kishino, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/070,802

(22) PCT Filed: Mar. 14, 2000

(86) PCT No.: PCT/JP00/01523

§ 371 (c)(1),
(2), (4) Date: Mar. 12, 2002

(87) PCT Pub. No.: WO01/69796

PCT Pub. Date: Sep. 20, 2001

(30) Foreign Application Priority Data

Jan. 29, 1999 (JP) .................................. 11-21044

(51) Int. Cl.
*H03D 1/00* (2006.01)

(52) U.S. Cl. ...................... 375/341; 375/262; 714/795; 714/796

(58) Field of Classification Search ................ 375/341, 375/262; 714/795, 796, 794
See application file for complete search history.

(56) References Cited

U.S. PATENT DOCUMENTS

| | | | | |
|---|---|---|---|---|
| 5,295,142 A * | 3/1994 | Hatakeyama | ................ | 714/794 |
| 5,398,254 A * | 3/1995 | Miya et al. | ................. | 714/795 |
| 5,471,500 A | 11/1995 | Blaker et al. | | |
| 5,509,021 A * | 4/1996 | Todoroki | .................... | 714/795 |
| 6,637,004 B1 * | 10/2003 | Mizuno et al. | ............. | 714/796 |

FOREIGN PATENT DOCUMENTS

| | | | |
|---|---|---|---|
| FR | 2 769 434 A1 | 4/1999 |
| JP | 63-122323 A | 5/1988 |
| JP | 6-232918 A | 8/1994 |
| JP | 06-338808 A | 12/1994 |
| JP | 7-245567 A | 9/1995 |
| JP | 08-032633 A | 2/1996 |
| JP | 8-32633 A | 2/1996 |
| JP | 2000-216688 A | 8/2000 |

OTHER PUBLICATIONS

Notification of Reasons(s) for Refusal mailed Jun. 17, 2003 in corresponding Japanese Application No. 11-021044.
Korean Office Action and English translation thereof mailed Jul. 28, 2004 in corresponding Korean Application No. 10-2002-7004693.
European Search Report mailed May 4, 2005 in corresponding EP application No. 00908047.4-1247-JP0001523.
Shung et al, "VLSI Architectures for Metric Normalization in the Viterbi Algorithm", International Conference on Communications including Supercomm Technical Sessions, Atland, Apr. 15-19, 1990, New York, IEEE, US, vol. VOL 4, Apr. 15, 1990, pp. 1723-1728.

* cited by examiner

*Primary Examiner*—Temesghen Ghebretinsae
(74) *Attorney, Agent, or Firm*—Nixon & Vanderhye, P.C.

(57) ABSTRACT

In a Viterbi decoder a bit range converter (11) is provided for converting a bit range of the branch metric values calculated by a branch metric calculator (1) to meet the number of calculation bits used in an ACS portion (2). The bit range converter (11) is provided between branch metric calculator (1) and ACS portion (2). The decoder reads the received data and calculates the branch metrics, optimizes the branch metrics, changes the path metric, and stores it into the path memory until the frame is completed. When one frame has been completed the decoded result is output by backtracing.

2 Claims, 23 Drawing Sheets

FIG. 5

| RECEIVED LEVEL (AFTER QUANTIZATION) | 0 | 1 | 2 | 3 | 4 | 5 | 6 | 7 |
|---|---|---|---|---|---|---|---|---|
| METRIC FOR INFORMATION BIT '0' | 0 | 1 | 2 | 3 | 4 | 5 | 6 | 7 |
| METRIC FOR INFORMATION BIT '1' | 7 | 6 | 5 | 4 | 3 | 2 | 1 | 0 |

FIG. 16

| RECEIVED LEVEL (AFTER QUANTIZATION) | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| METRIC FOR INFORMATION BIT '0' | 0 | 1 | 2 | 3 | 4 | 5 | 6 | 7 | 8 | 9 | 10 | 11 | 12 | 13 | 14 | 15 |
| METRIC FOR INFORMATION BIT '1' | 15 | 14 | 13 | 12 | 11 | 10 | 9 | 8 | 7 | 6 | 5 | 4 | 3 | 2 | 1 | 0 |

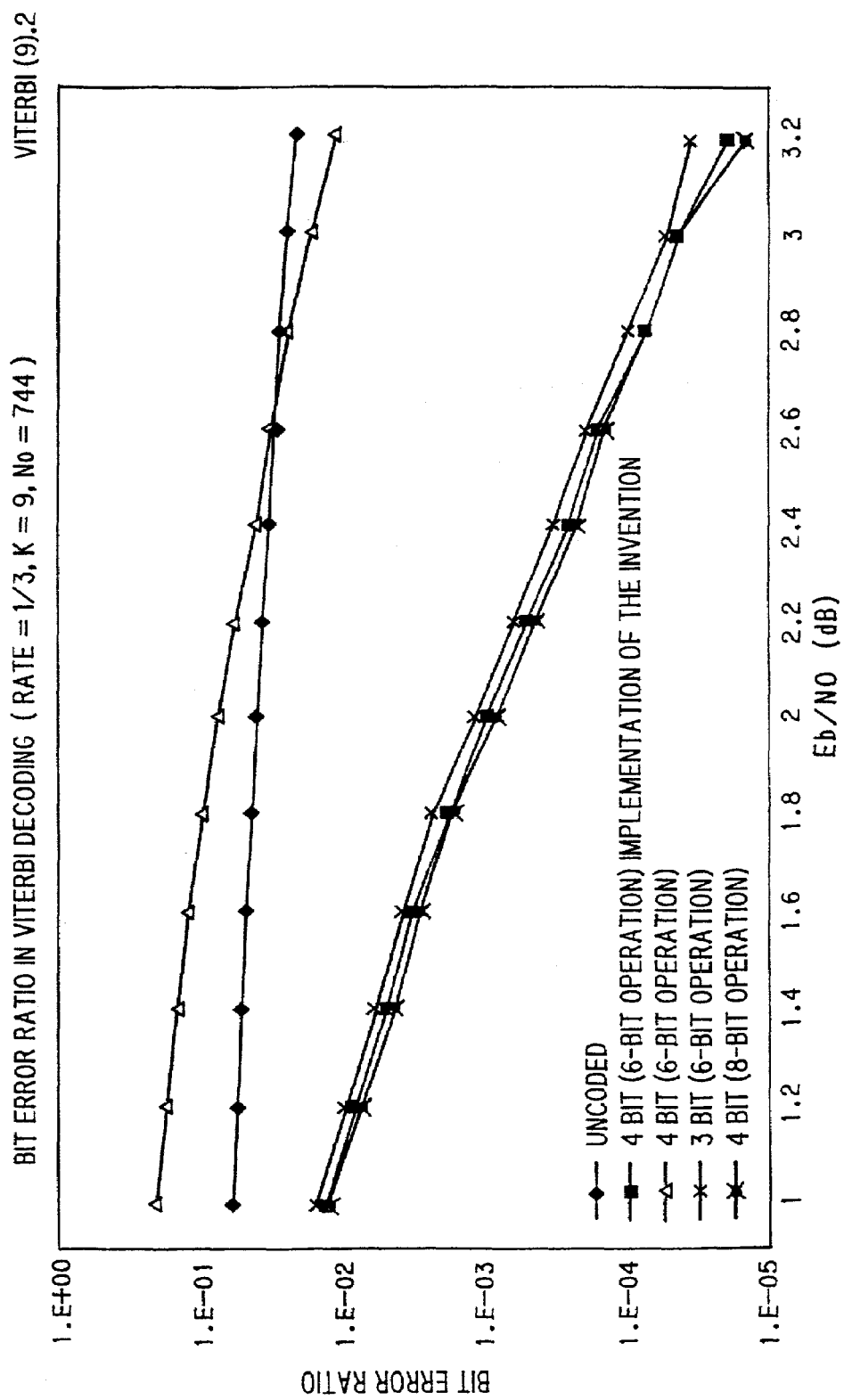

VITERBI DECODER

TECHNICAL FIELD

The present invention relates to a Viterbi decoder which performs error correction of received convolutional codes.

BACKGROUND ART

Conventionally, the Viterbi decoding technique for performing maximum likelihood decoding of convolutional codes has been known. In this Viterbi decoding technique, since a sequence closest to the received code sequence is selected, based on the Viterbi decoding algorithm, from the code sequences which could be generated on the transmitting side encoder, it is possible to decode the received codes even when they involve errors. In this way, the Viterbi decoding technique has a high correcting capability against random errors arising over the communication path, and in particular, this technique can provide a great coding gain when combined with soft decision decoding. Therefore, Viterbi decoders have been widely adopted to decode error correction codes for mobile communications systems and others.

To begin with, the Viterbi algorithm will be described briefly with reference to convolutional codes with a coding rate of 1/2 and a constraint length K=3 which are given by generator polynomials, $$G1(D)=1+D^2$$

$$G2(D)=1+D+D^2$$

where 'D' indicates the data delay and '+' indicates addition of one bit only.

FIG. 1 is a block diagram showing a configuration of a Viterbi decoder for generating the above convolutional codes. As shown in FIG. 1, the Viterbi decoder is comprised of shift registers, namely registers 101A and 101B, and adders 102A, 102B and 102C for performing modulo-two addition. This decoder has four internal states, each given by (b1, b2), explicitly: internal state (0,0), internal state (0,1), internal state (1,0) and internal state (1,1). Each internal state can make a transition to two internal states when an input is given.

Specifically, as shown in FIG. 2, in the case of internal state (0,0) the decoder makes a transition to internal state (0,0) when the input is 0 and a transition to internal state (0,1) when the input is 1; in the case of internal state (0,1) the decoder makes a transition to internal state (1,0) when the input is 0 and a transition to internal state (1,1) when the input is 1; in the case of the internal state (1,0) the decoder makes a transition to internal state (0,0) when the input is 0 and a transition to internal state (0,1) when the input is 1; and in the case of the internal state (1,1) the decoder makes a transition to internal state (1,0) when the input is 0 and a transition to internal state (1,1) when the input is 1.

FIG. 3 is a trellis diagram showing the above internal state transitions. In the diagram, the branches represented by solid line indicate transitions when the input is '0' and the branches represented by dashed line indicate transitions when the input is '1'. The numerals attached to each branch are the code symbols (G1, G2) output when the transition of the branch occurs. As seen in this diagram, two paths always merge at each state. In the Viterbi algorithm, the maximum likelihood path is selected from the two paths at each internal state, and when survivor paths up to a predetermined length have been selected, the most probable one is detected from the selected paths at different internal states to thereby decode the received codes.

The selection of the maximum likelihood path is made based on the probability information of each of the merging paths. In a hard-decision Viterbi algorithm, the Hamming distances between each path bit sequence and the received bit sequence are summed to produce the probability of the path. In a soft-decision Viterbi algorithm, the squares of the Euclidean distances between each path bit sequence and the received bit sequence are summed to produce the probability of the path.

In the description hereinbelow, the value presenting the probability of a path is called path metric, and the value presenting the probability for each unit period of reception is called branch metric. The path metric can be translated as a sum of the probabilities of transitions to a certain internal state. The branch metric can be translated as a sum of the probabilities of individual bits at a transition from one internal state to the next internal state.

The Euclidean distance between two strings of data, i.e., received data ($r_1$, $r_2$) and data ($s_1$, $s_2$) generated by a transmission meter is given as expression as follows:

$$\sqrt{(s_1-r_1)^2+(s_2-r_2)^2}$$

In Viterbi decoding, the square of the Euclidean distance is expressed as:

$$(s_1-r_1)^2+(s_2-r_2)^2=s_1^2-2\times s_1\times r_1+r_1^2+s_2^2-2\times s_2\times r_2+r_2^2$$

and data ($s_1$, $s_2$) which minimizes the above value of the expression is determined.

Here, since received data ($r_1$, $r_2$) is fixed and hence $r_1$ and $r_2$ are constant regardless of the values ($s_1$, $s_2$), these can be omitted from the expression. Further, as to the transmitted data ($s_1$, $s_2$), for elements $s_1$ and $s_2$, assuming $s_1$ or $s_2$ to be '−1' when the data is '0' and assuming $s_1$ or $s_2$ to be '1' when the data is '1', $s_1^2$ and $s_2^2$ are constant regardless of the values ($s_1$, $s_2$), so that these can be omitted from the expression. Further, when the remaining part is divided by 2, the expression is reduced to $-s_1\times r_1-s_2\times r_2$.

From this expression, if $s_1$=−1, $-s_1\times r_1$ is $r_1$. Hence if $r_1$=−1, the term $-s_1\times r_1$ is reduced to −1, if $r_1$=0, the term is reduced to 0, and if $r_1$=1, the term is reduced to 1. If $s_1$=1, $-s_1\times r_1$ is $-r_1$. Hence if $r_1$=−1, the term is reduced to 1, if $r_1$=0, the term is reduced to 0, and if $r_1$=−1, the term is reduced to 1.

Accordingly, $-s_1\times r_1$ results in a value linearly varying from 0 to 2 in accordance with received data $r_1$(−1 to 1) if $s_1$=−1 whereas $-s_1\times r_1$ results in a value linearly varying from 2 to 0 in accordance with received data $r_1$ (−1 to 1) if $s_1$=1. When the resolution of received data $r_1$ shown in FIG. 4 is set at 3 bits, the metrics shown in FIG. 5 can be obtained from the above method.

Next, operations based on soft-decision processing will be described. In contrast to the hard-decision process which uses binary signals '0' and '1', the soft-decision process performs decisions based on multi-levels signals. In soft-decision using eight levels with three bits as shown in FIGS. 4 and 5, assuming only one bit data, when the information bit is '0', if the received level is '0', the branch metric results in '0' and if the received level is '7', the branch metric results in '7'. When the information bit is '1', if the received level is '01', the branch metric results in '7' and if the received level is '7', the branch metric results in '0'. It should be noted that the smaller this branch metric value, the more probable the branch is.

FIG. 6 is a trellis diagram showing a soft-decision metric processing example. In this soft-decision metric process, suppose that an information sequence is given as '0110000', the code sequence is given as '00', '11', '10', '10', '11', '00' and '00', and the received sequence is given as '2', '4', '3', '6', '7', '2', '7', '5', '5', '7', '1', '0', '1' and '2'. For the transition from the internal state '00' at time instant '0' to the internal state '00' at time instant '1', since the probability for the first bit '0' is '2' and the probability for the second bit '0' is '4', the metric results in '2+4'='6'. The branch metrics for all the paths can be obtained in the same way. In the diagram, the numeral along each line segment denotes the branch metric and the numeral in hatching located at each internal-state and time-instant point denotes the path metric.

As a result of the calculation, the two paths merging into the internal state '00' at time instant '7' are one from the internal state '00' at time instant '6' and the other from the internal state '10' at time instant '6'. As to the path from the internal state '00' at time instant '6', the path metric at time instant '6'/internal state '00' is '21' and the branch metric from the internal state '00' at time instant '6' to the internal state '00' at time instant '7' is '3', so that the probability of the path results in '24'. On the other hand, as to the path from the internal state '10' at time instant '6', the path metric at time instant '6'/internal state '10' is '32' and the branch metric from the internal state '10' at time instant '6' to the internal state '00' at time instant '7' is '11', so that the probability of the path results in '43'. Therefore, '24' is assumed as the path metric at time instant '7'/internal state '00' that is, the path from the internal state '00' at time instant '6' to the internal state '00' at time instant '7' is selected. Here, in the diagram, 'x' denotes the discarded path at the merging point.

As shown in FIG. 7, by tracing the survivor path along the arrows or in the reverse direction of the sequence of the received data, the decoded result can be obtained. In FIG. 6, the underlined numerals of the received sequence denotes error bits in transmission. As understood from the decoded result, the original information sequence can be obtained even when three bits of errors have occurred.

FIG. 8 shows a typical configuration of a Viterbi decoder for decoding convolutional codes based on the Viterbi algorithm, which is comprised of a branch metric calculator 1 for calculating the branch metric between the received sequence and each branch; an ACS portion 2 for selecting the survivor path and calculating the path metric of the survivor path; a path metric memory 3 for storing the path metric value at each internal state; a path memory 4 for storing the estimated output of a selected path; and a backtracing processor 5 for detecting the address of the most probable path metric and performing control of the path memory.

The Viterbi decoder thus configured operates, as shown in the flowchart in FIG. 9, in such a manner that it reads the received data and calculates branch metrics and updates the path metric into the path memory (Steps S2 to S5) until one entire frame is completed and when the frame has been completed (Step S1) then it outputs the decoded result by backtracing (Step S6).

For such Viterbi decoders, various techniques have been proposed in order to improve calculation efficiency. As shown in FIG. 10, a technique (see Japanese Patent Application Laid-Open Sho 63 No. 122323) is disclosed in which a soft-decision data converting circuit A is provided so as to convert the input data in accordance with the circumstances so that it is used for calculations of branch metrics to thereby assign weights to the input bits. Another technique (see Japanese Patent Application Laid-Open Hei 7 No. 245567) is disclosed as shown in FIG. 11, in which a normalizing circuit (maximum likelihood value subtraction) B is provided to search for the maximum likelihood value from all the branch metrics and subtract the value from each branch metric so as to narrow the data range to thereby determine the maximum likelihood value in branch metric.

Use of soft-decision of the Viterbi algorithm improves error collection characteristics as the bit precision of input data is enhanced, as seen in the BER characteristic chart in FIG. 12. However, enhancement of the bit precision of input data increases the number of bits handled in the internal processor, leading to the problem of system scale enlargement. The same problem occurs with the method of assigning weights on the input bits and with the normalizing method by determining the maximum likelihood value in branch metric.

Illustratively, as shown in the BER characteristic chart in FIG. 12, in a case of a Viterbi decoding process with a constraint length of 9 and a coding rate of 1/3, for example, when the bit accuracy of input data is set at three bits, the data can be correctly processed by an ACS portion having six or more internal operational bits if the process is combined with appropriate normalization. However, when the input bit accuracy is set at four bits, not less than 7 or 8 internal operational bits are needed in the ACS portion even in combination with an appropriate normalization process. The internal operational bit length increases from six bits to 8 bits, the circuit scale also needs to be enlarged proportionally, to as large as a little over 1.3 times.

It is therefore an object of the present invention to provide a Viterbi decoder which is able to improve error correction characteristics while suppressing enlargement of the system scale.

DISCLOSURE OF INVENTION

In order to solve the above problem, the present invention is configured as follows.

The first aspect of the present invention is a Viterbi decoder comprising: a branch metric calculating portion for calculating a branch metric value based on a received sequence; a bit range converting portion for converting a bit range of the branch metric value calculated by the branch metric calculating portion; a path metric calculating portion for calculating a path metric value based on the branch metric values whose bit range has been converted by the bit range converting portion; and a decoding portion for decoding received codes based on the path metric value calculated by the path metric calculating portion.

The second aspect of the present invention is, in addition to the Viterbi decoder defined in the first aspect, is characterized in that the bit range converting portion converts the bit range by truncating a least significant bit of the branch metric value calculated by the branch metric calculating portion.

The third aspect of the present invention is a method of Viterbi decoding comprising the steps of: calculating a branch metric value based on a received sequence; calculating a path metric value based on the branch metric values; and decoding received codes based on the path metric value, the method being characterized in that a bit range of the branch metric value is converted and the path metric value is calculated based on the branch metric values whose bit range has been converted.

According to the configurations of the present invention, the following effects can be obtained.

According to the first configuration, the branch metric calculating portion calculates branch metric values based on the received sequence, then the bit range converting portion converts the bit range of the calculated branch metric values into that operable by the path metric calculating portion. The path metric calculating portion calculates the path metric value based on the branch metric values whose bit range has been converted. The decoding portion decodes the received codes based on the calculated path metric value. Thereby, it is possible to improve the bit accuracy of input data without increasing the number of internal operational bits handled in the path metric calculating portion.

According to the second configuration, the branch metric calculating portion calculates branch metric values based on a received sequence, then the bit range converting portion omit the least significant bit of the calculated branch metric values so as to converts the bit range of them into that operable by the path metric calculating portion. The path metric calculating portion calculates the path metric value based on the branch metric values whose bit range has been converted. The decoding portion decodes the received codes based on the calculated path metric value. Thereby, it is possible to improve the bit accuracy of input data without increasing the number of internal operational bits handled in the path metric calculating portion.

According to the third configuration, branch metric values are calculated based on the received sequence, the bit range of the branch metric values is converted and the path metric value is calculated based on the branch metric values whose bit range has been converted. Then the received codes are decoded based on the path metric value. Thereby, it is possible to improve the bit accuracy of input data without increasing the number of operational bits for calculation of the path metric value.

BRIEF DESCRIPTION OF DRAWINGS

FIG. 5 is an illustrative chart showing the metrics of information bits with a received bit precision set at 3 bits;

FIG. 16 is an illustrative chart showing the metrics of information bits when the received bit precision is set at four bits;

FIG. 25 is a partially enlarged chart of the same BER characteristic chart.

BEST MODE FOR CARRYING OUT THE INVENTION

The embodiment of the present invention will hereinbelow be described in detail with reference to the drawings.

Figure 1:
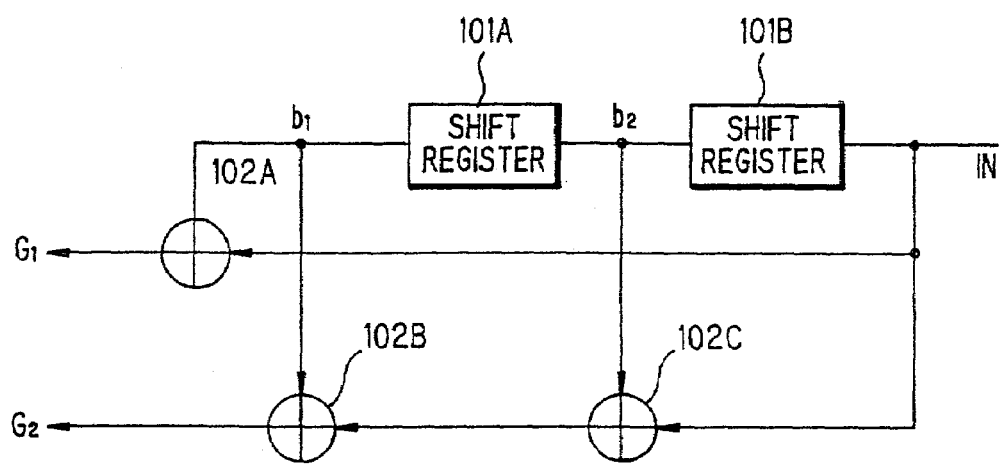
FIG. 1 is a block diagram showing a conventional example of a convolutional encoder.
Figure 2:
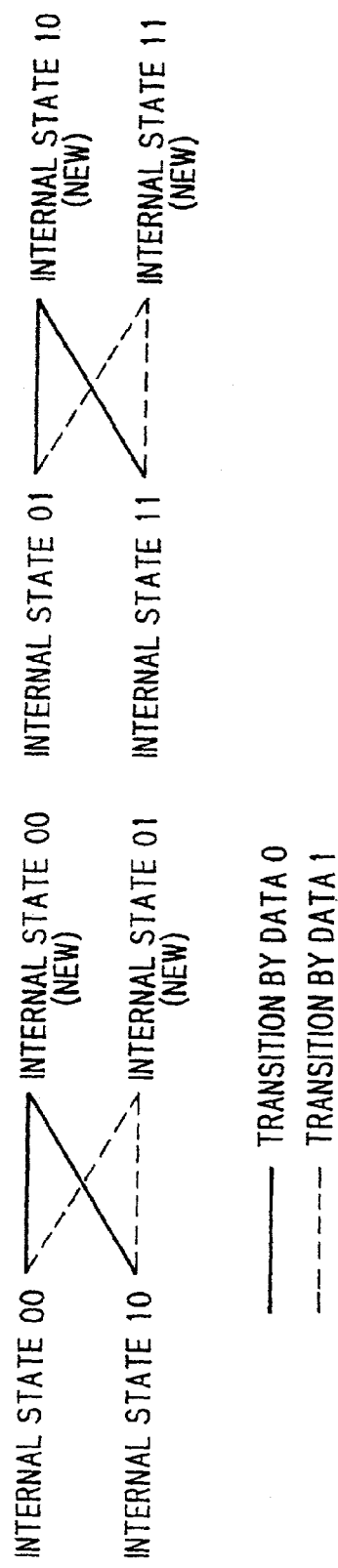
FIG. 2 is an illustrative diagram showing internal state transitions in the same convolutional encoder.
Figure 3:
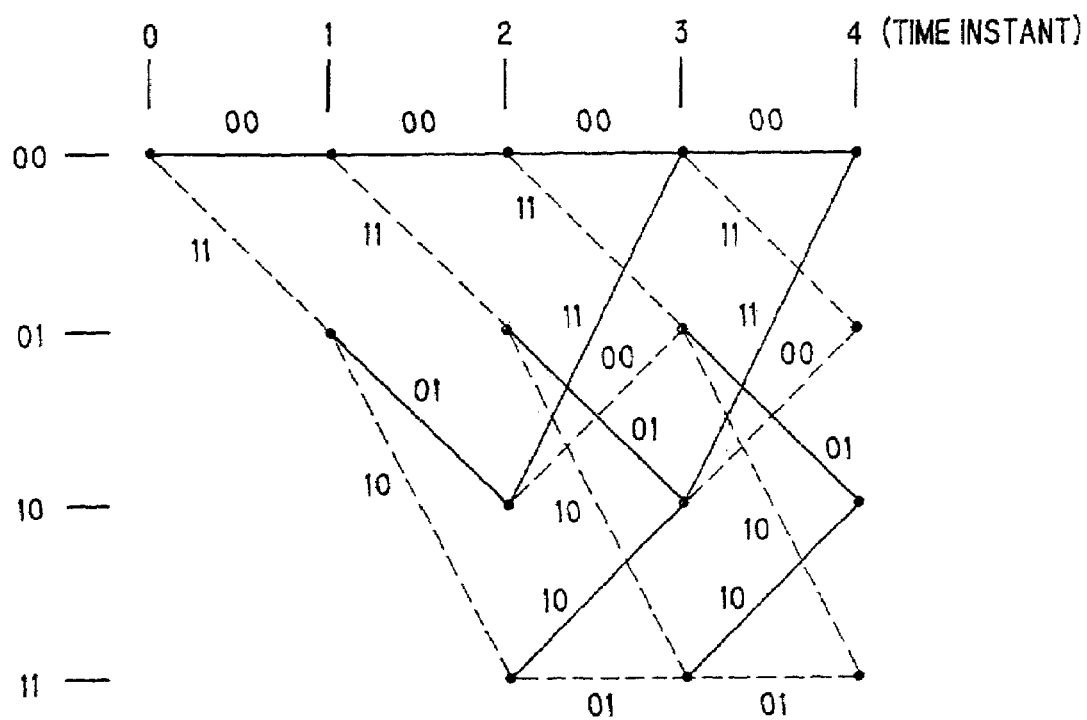
FIG. 3 is a trellis diagram showing internal state transitions in the same convolutional encoder.
Figure 4:
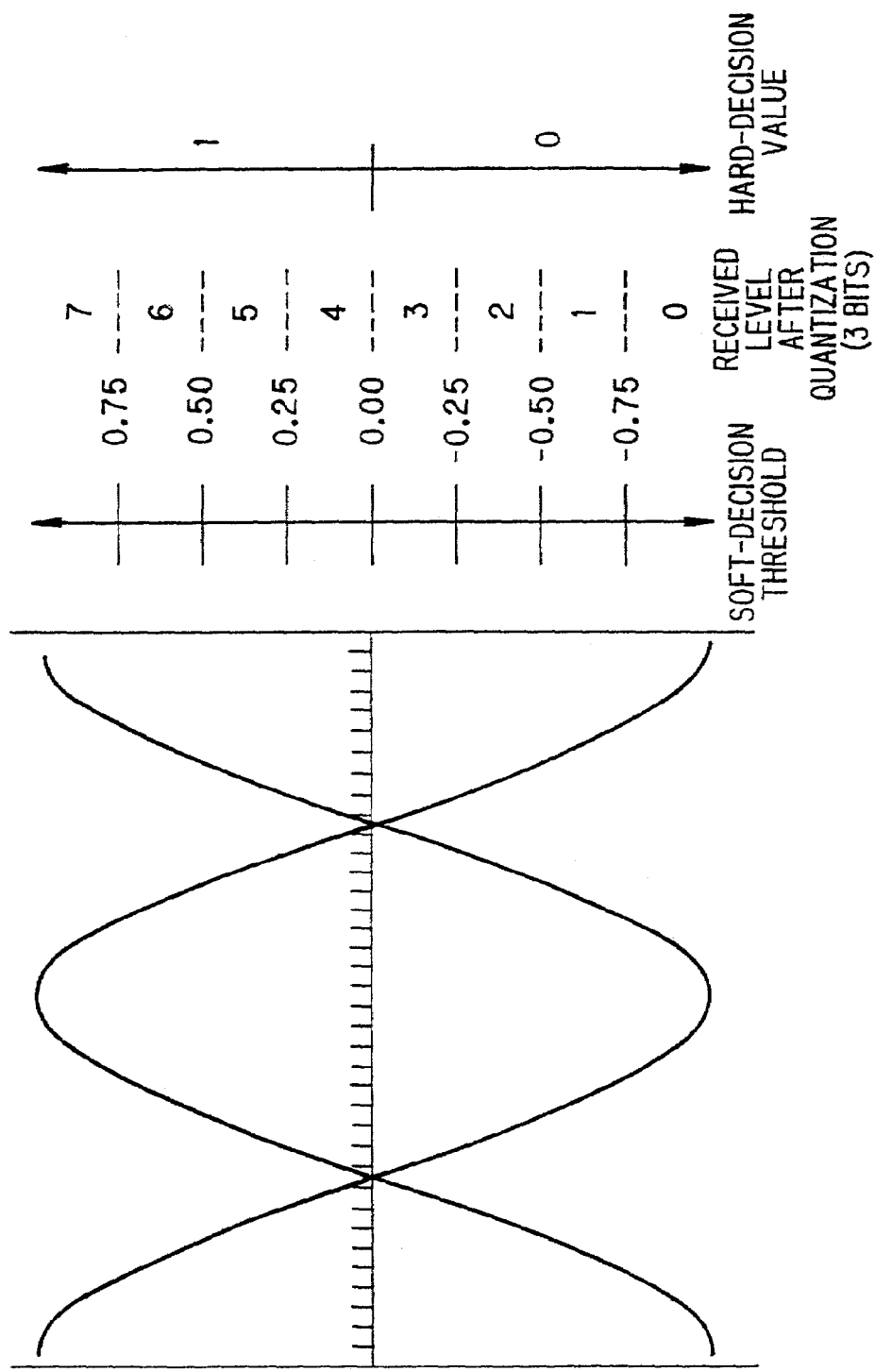
FIG. 4 is an illustrative chart showing an example of a soft-decision signal.
Figure 6:
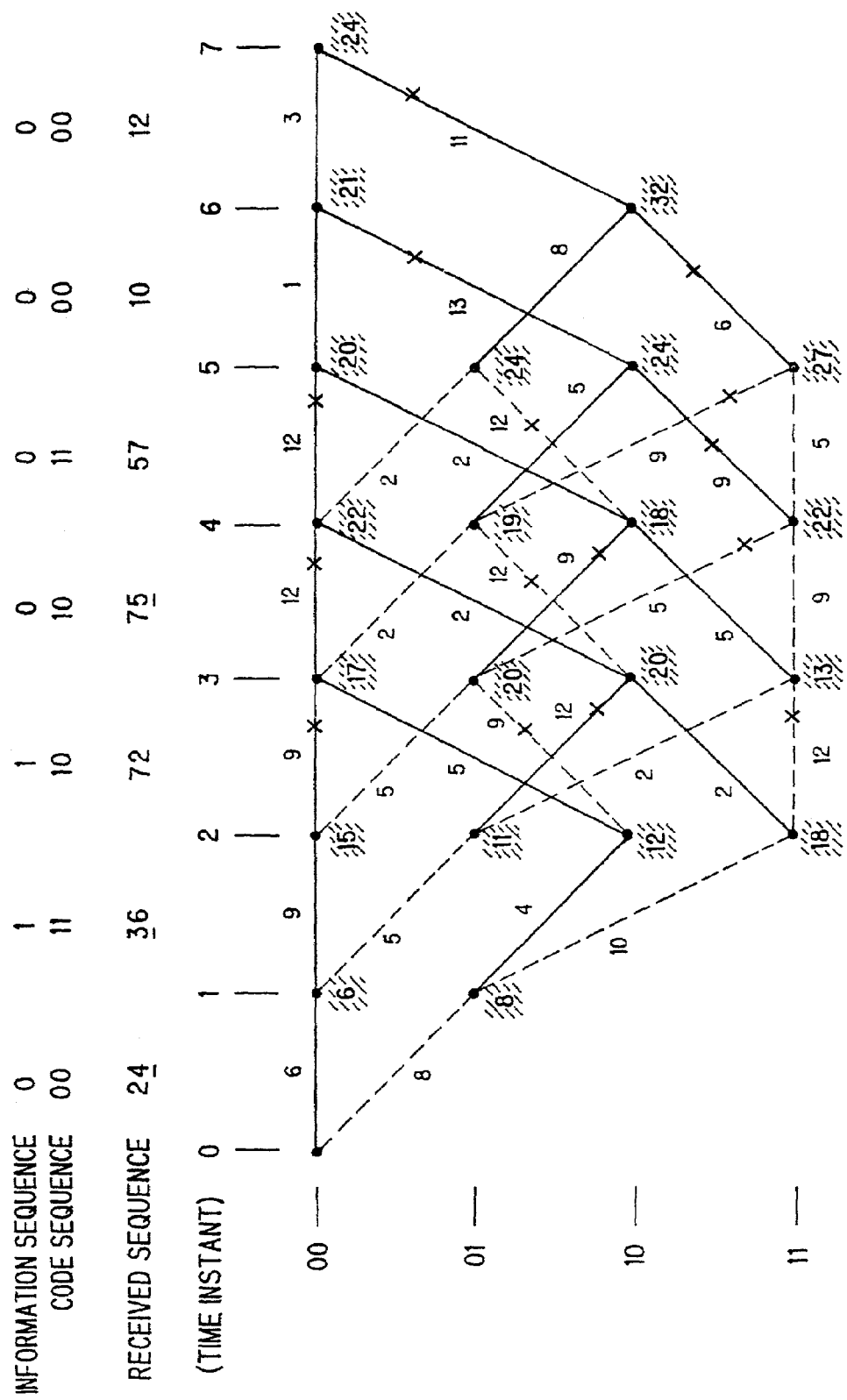
FIG. 6 is a trellis diagram showing internal state transitions in a conventional soft-decision process.
Figure 7:
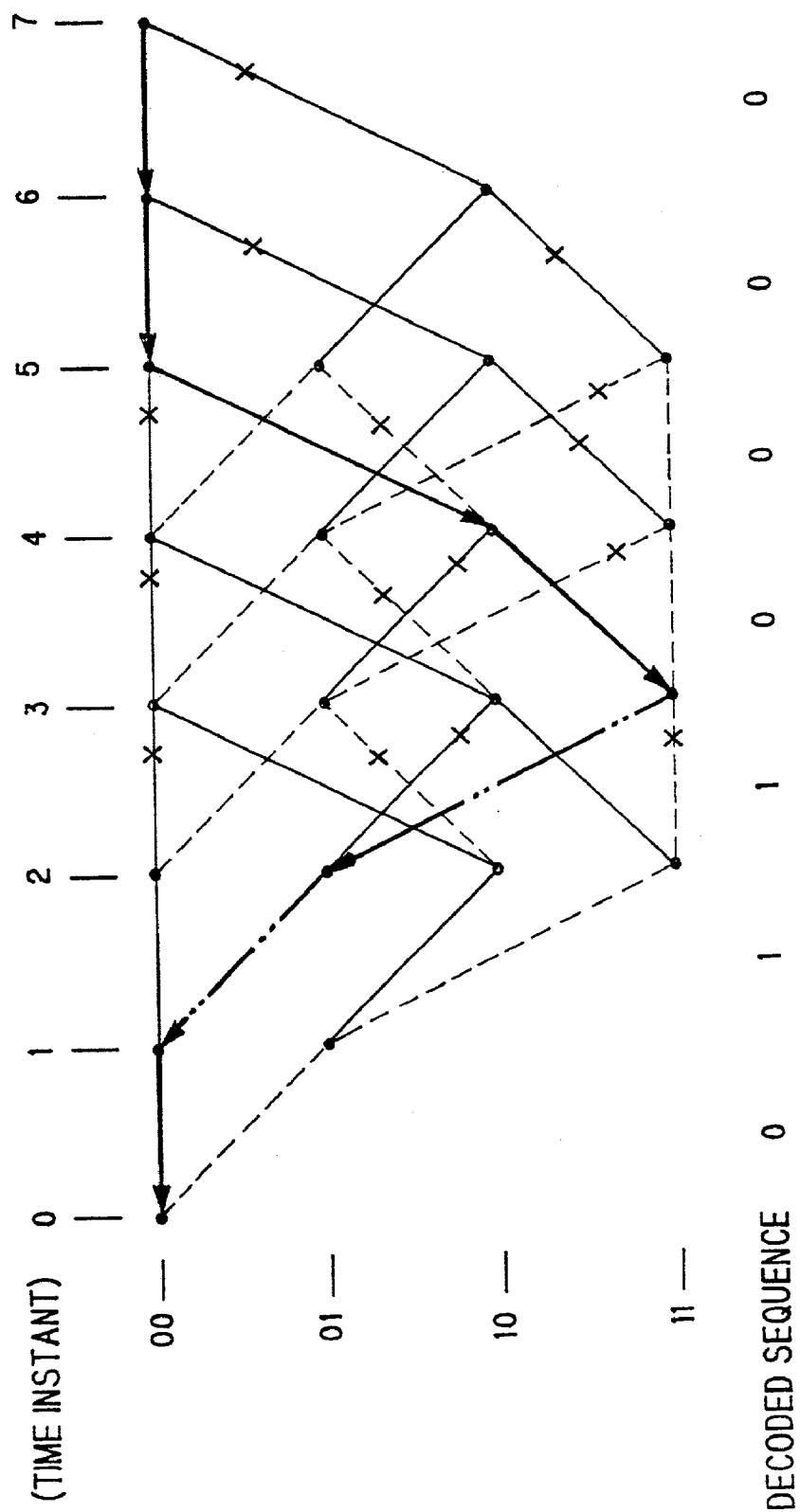
FIG. 7 is an illustrative diagram showing a decoding process in the same trellis diagram.
Figure 8:
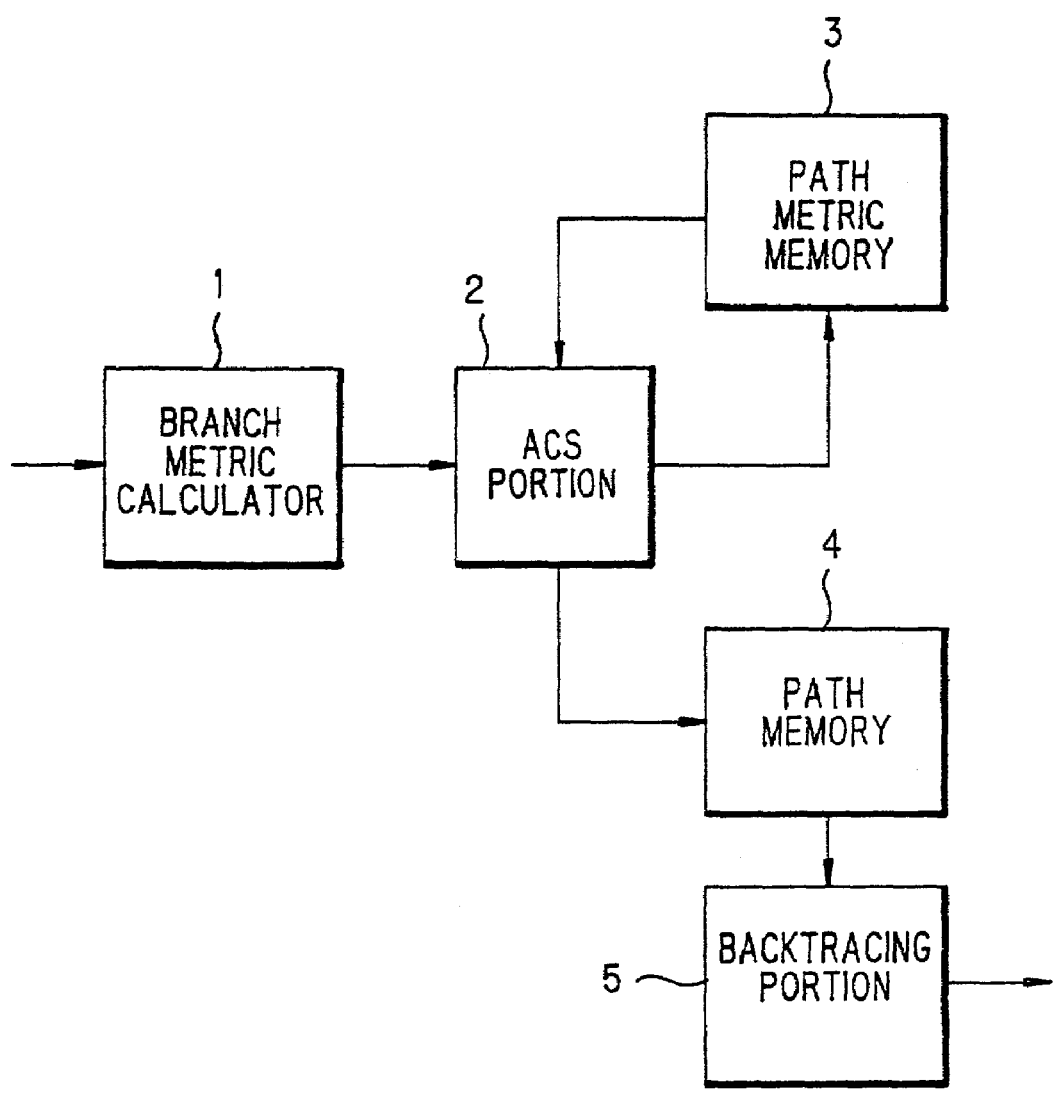
FIG. 8 is a block diagram showing a configuration of a conventional Viterbi decoder.
Figure 9:
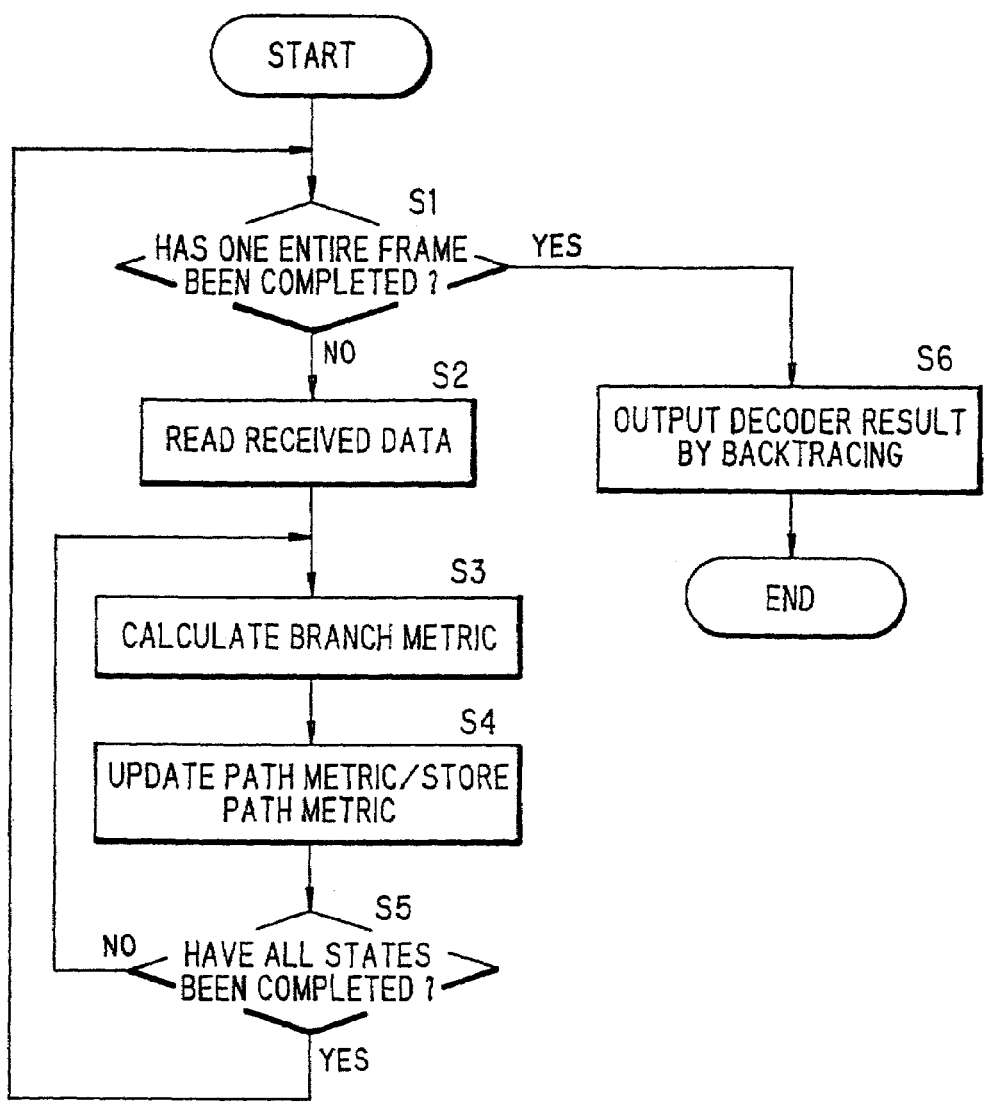
FIG. 9 is a flowchart for illustrating the processing sequence of Viterbi decoding in the same Viterbi decoder.
Figure 10:
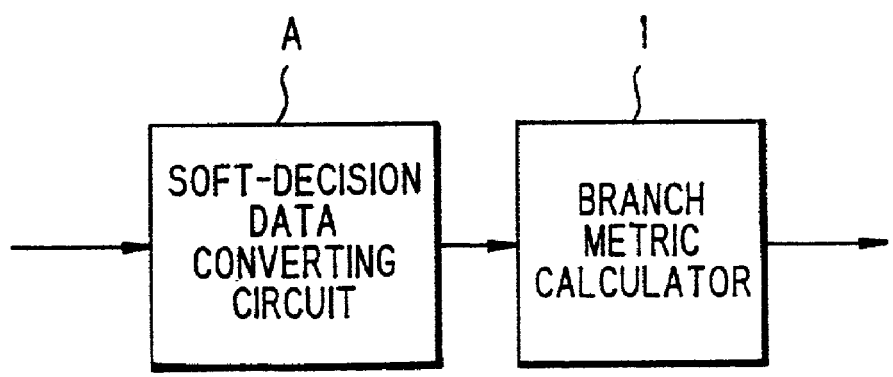
FIG. 10 is a block diagram showing an example of branch metric calculation according to a conventional example.
Figure 11:
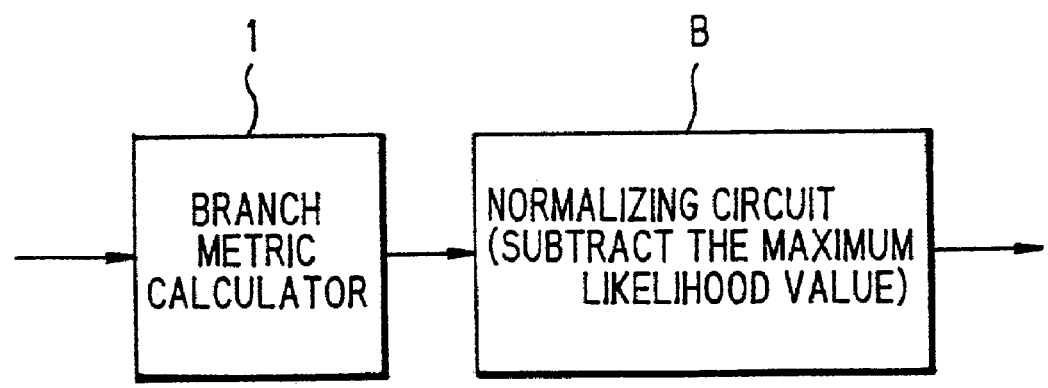
FIG. 11 is a block diagram showing another example of branch metric calculation according to a conventional example.
Figure 12:
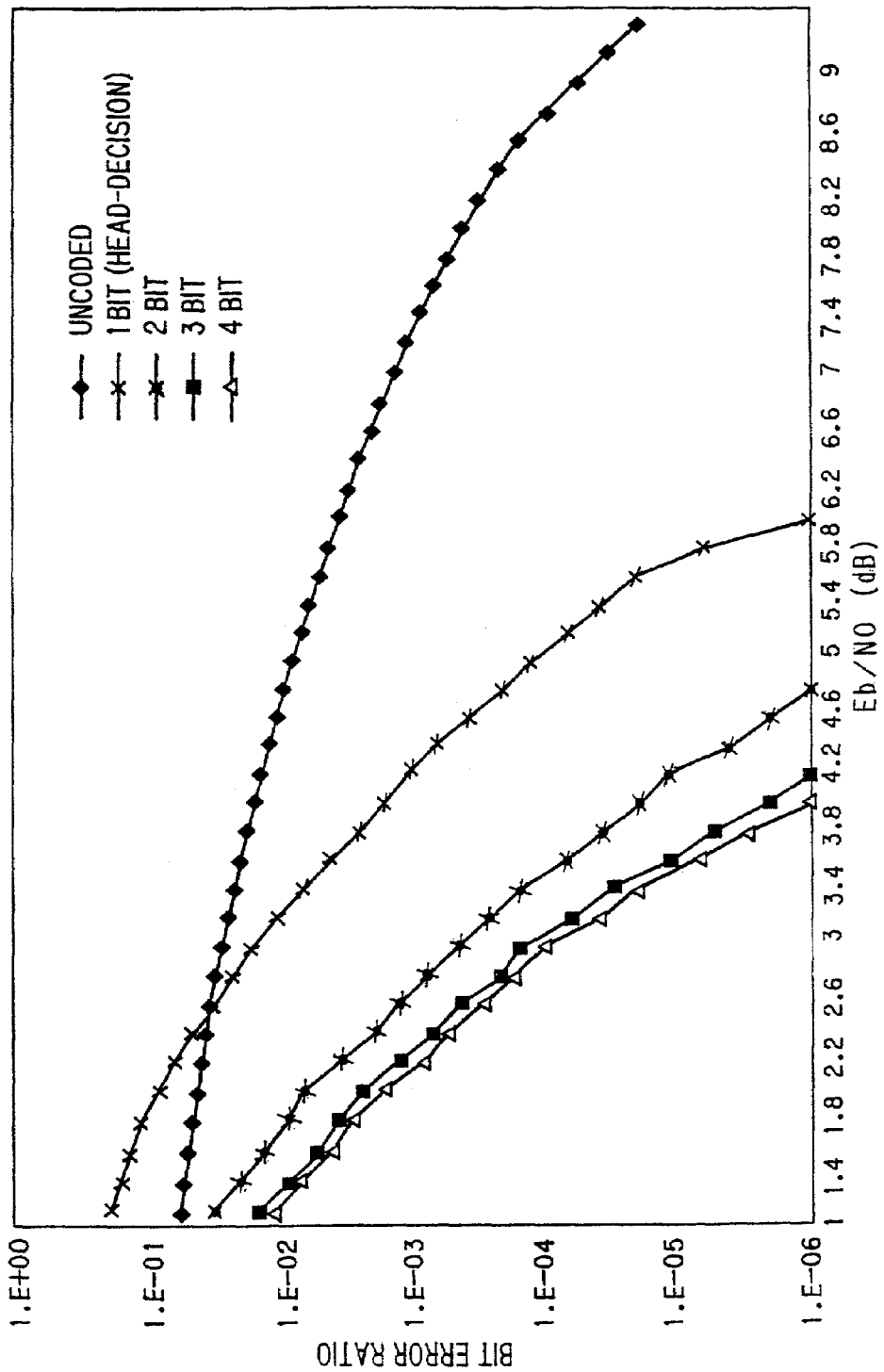
FIG. 12 is a BER characteristic chart showing the BER characteristic of a conventional example.
Figure 13:
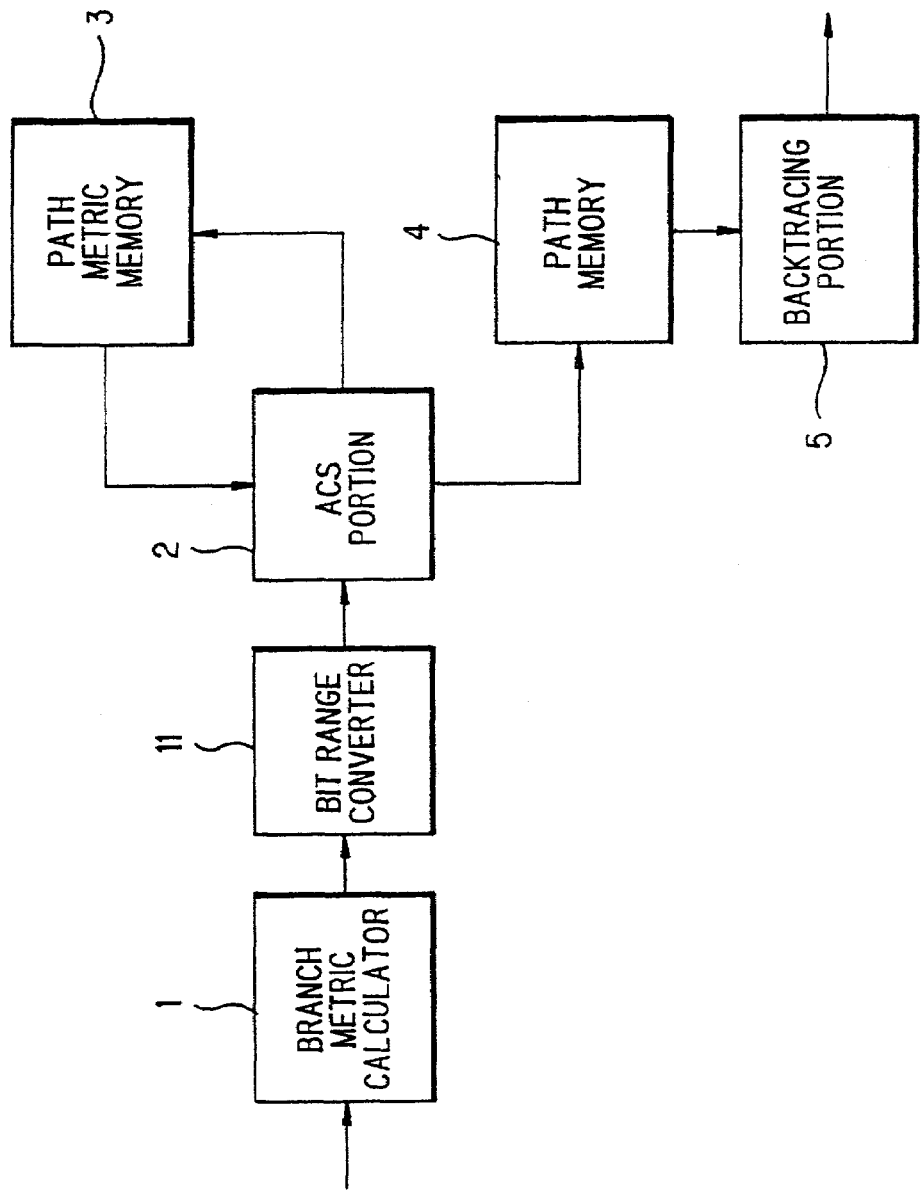
FIG. 13 is a block diagram showing a configuration of a Viterbi decoder according to one embodiment of the present invention.

FIG. 13 is a block diagram showing a configuration of a Viterbi decoder according to one embodiment of the present invention. This decoder is comprised of a branch metric calculator 1 for calculating the metric between the received sequence and each branch, a bit range converter 11 for converting the bit range of branch metric values calculated by branch metric calculator 1 so as to be suitable to the number of calculation bits to be used in an ACS portion 2, ACS portion 2 for selecting a survivor path and calculating the path metric of the survivor path, a path metric memory 3 for storing the path metric value of each internal state, a path memory 4 for storing the estimated output of a selected path; and a backtracing processor 5 for detecting the address of the most probable path metric and performing control of the path memory.

Figure 14:
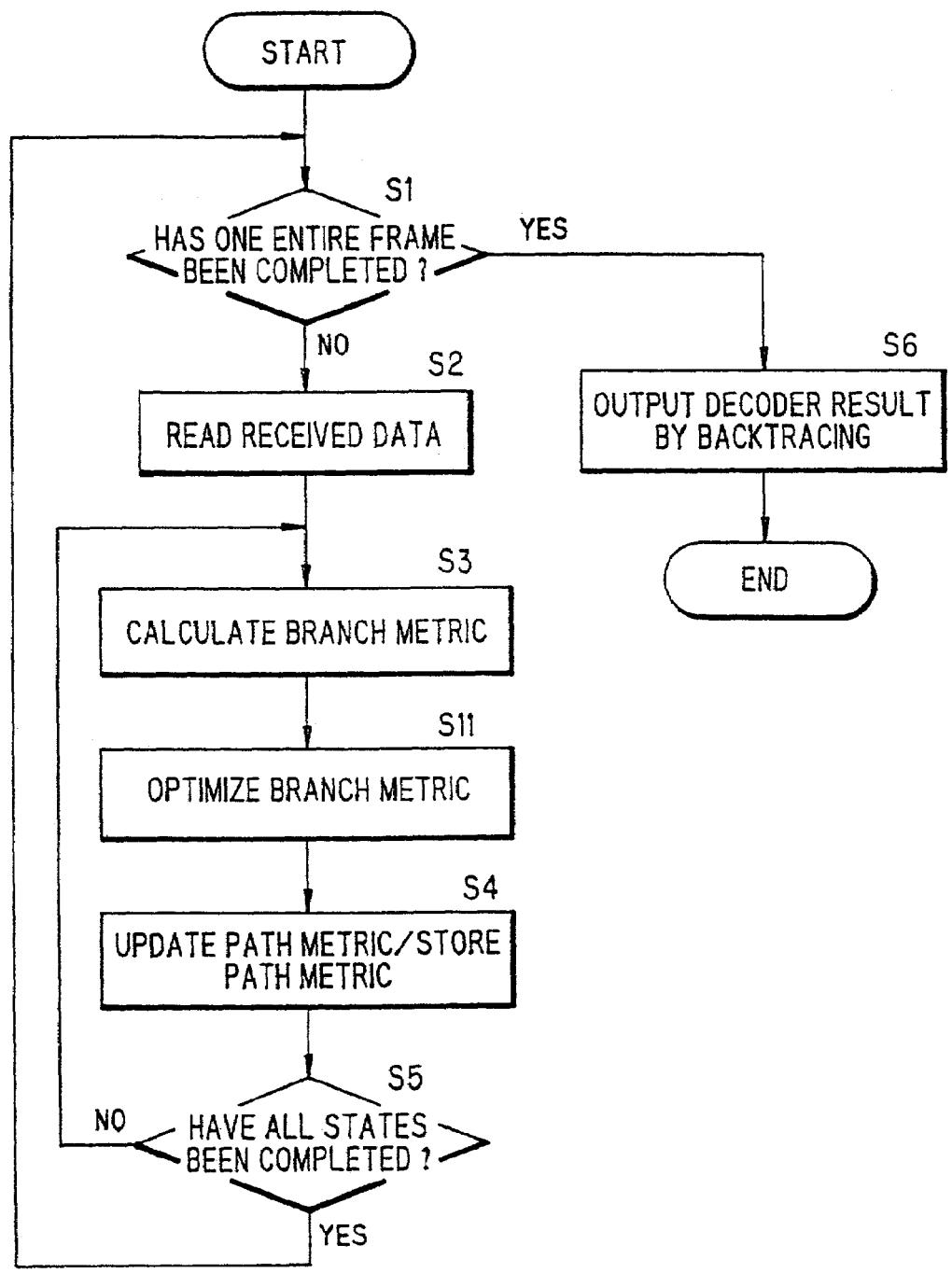
FIG. 14 is a flowchart for illustrating the processing sequence of Viterbi decoding in the same Viterbi decoder.

The Viterbi decoder thus configured operates, as shown in the flowchart in FIG. 14, in such a manner that it reads the received data and calculates the branch metrics, optimizes the branch metrics and updates the path metrics and stores them into the path memory (Steps S2 to S5, S11) until one frame is completed and when the frame has been completed (Step S1) then it outputs the decoded result by backtracing (Step S6).

To begin with, a Viterbi decoder configured as above with its constraint length set at 3 and coding rate set at 1/2 will be described. The generator polynomials as follows are used:

$G0=1+D^2$ $G1=1+D+D^2$

Figure 15:
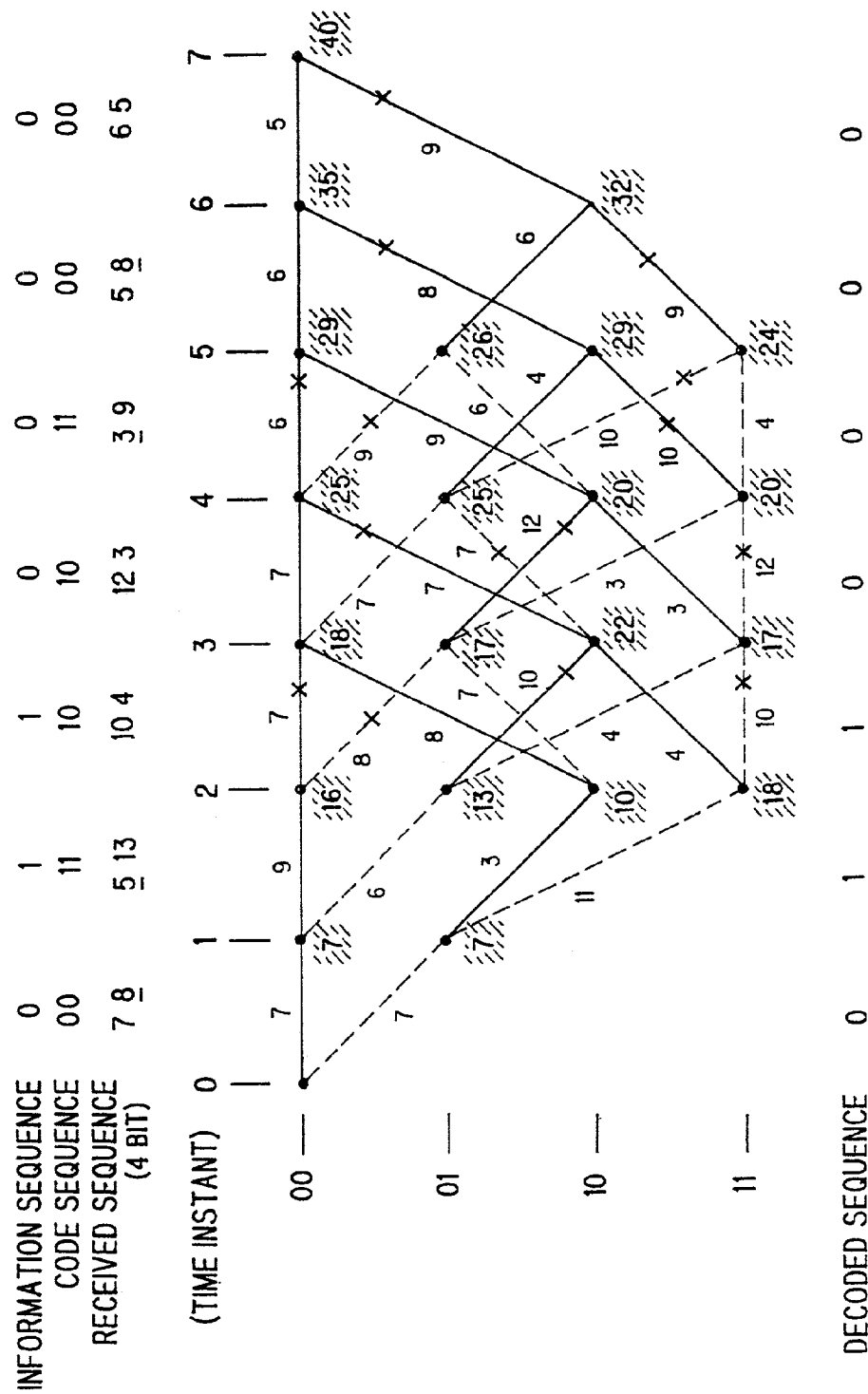
FIG. 15 is a trellis diagram showing internal state transitions in a soft-decision process using the same Viterbi decoder.

FIG. 15 is a trellis diagram showing a soft-decision metric processing example when the input bit precision is set at '4' in the Viterbi decoder thus configured as above. In this soft-decision metric process, suppose that an information sequence is given as '0110000', the code sequence is given as '00', '11', '10', '10', '11', '00' and '00', and the received sequence is given as '7', '8', '5', '13', '10', '4', '12', '3', '3', '9', '5', '8', '6' and '5'. In this case, for the transition from the internal state '00' at time instant '0' to the internal state '00' at time instant '1', as shown in the metric table in FIG. 16, the probability for the first bit '0' is '7' and the probability for the second bit '0' is '8', so that the metric results in '7+8'='15', or '1111', and then the least significant bit is omitted by bit range converter 11. Therefore, the metric results in '111' or '7'. The branch metrics for all the paths can be calculated in the same way. In the diagram, the numeral along each line segment denotes the branch metric and the numeral in hatching located at each internal-state and time-instant point denotes its path metric.

As a result of the calculation, the two paths merging into the internal state '00' at time instant '7' are one from the internal state '00' at time instant '6' and the other from the internal state '10' at time instant '6'. As to the path from the internal state '00' at time instant '6', the path metric at time instant '6'/internal state '00' is '35' and the branch metric from the internal state '00' at time instant '6' to the internal state '00' at time instant '7' is '5', so that the probability of the path results in '40'. On the other hand, as to the path from the internal state '10' at time instant '6', the path metric at time instant '6'/internal state '10' is '32' and the branch metric from the internal state '10' at time instant '6' to the internal state '00' at time instant '7' is '9', so that the probability of the path results in '41'. Therefore, '40' is assumed as the path metric at time instant '7'/internal state '00', that is, the path from the internal state '00' at time instant '6' to the internal state '00' at time instant '7' is selected. Here, in the diagram, 'x' denotes the discarded path at the merging point.

Then, by tracing the survivor path in the reverse direction of the sequence of the received data, the decoded result can be obtained. In FIG. 15, the underlined numerals of the received sequence denotes error bits in transmission. As understood from this decoded result, the original information sequence can be obtained even when four bits of errors have occurred.

Figure 17:
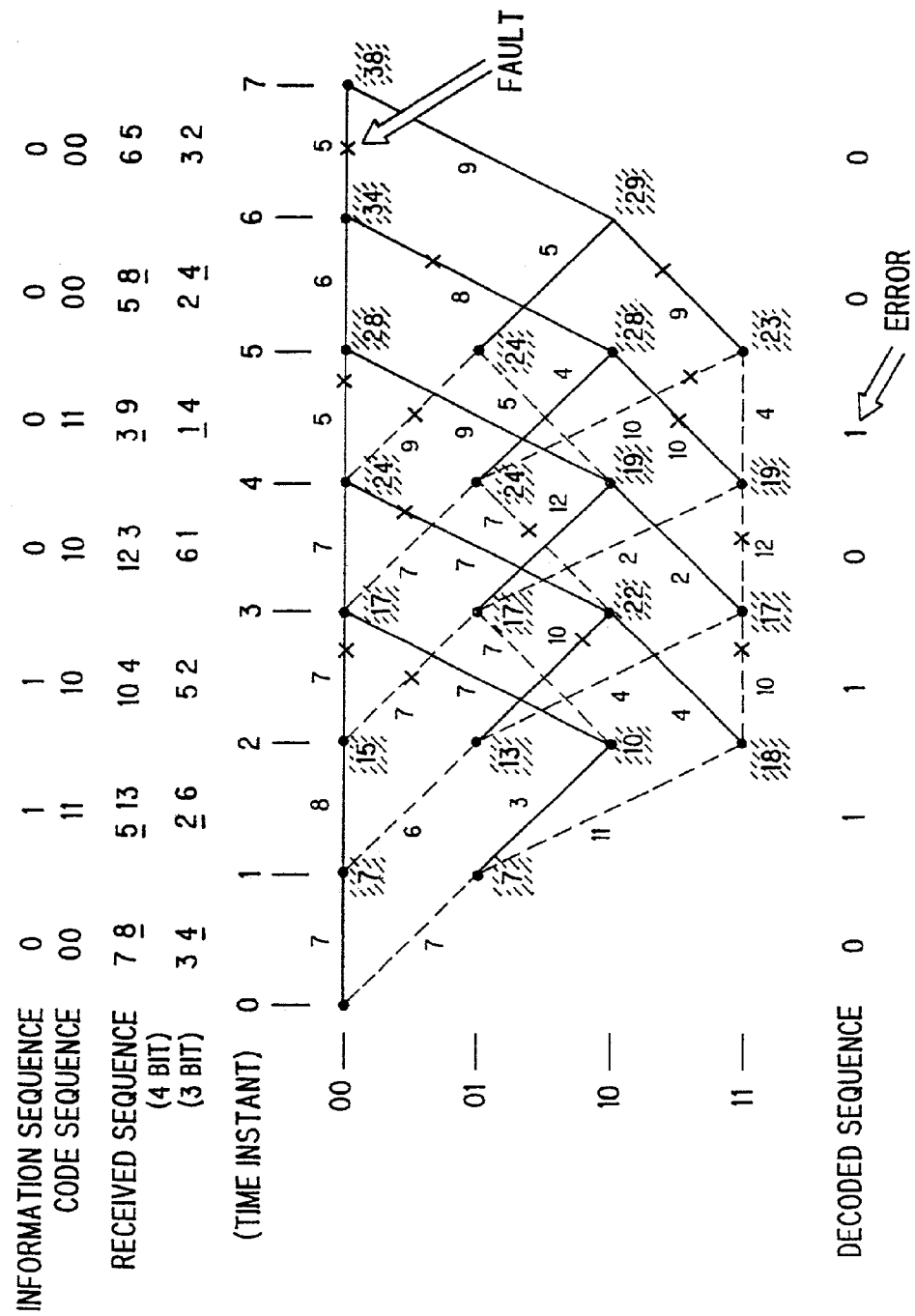
FIG. 17 is a trellis diagram when an error occurs in the soft-decision process according to a conventional example.

In contrast, when the same received signal is subjected to the soft-decision metric process with an input bit accuracy of '3' in the Viterbi decoder mentioned in reference to the prior art, the received sequence is obtained as '3', '4', '2', '6', '5', '2', '6', '1', '1', '4', '2', '4', '3' and '2', as shown in FIG. 17. Metric calculation based on this received sequence results as follows. That is, the two paths merging into the internal state '00' at time instant '7', are one from the internal state '00' at time instant '6' and the other from the internal state '10' at time instant '6'. As to the path from the internal state '00' at time instant '6', the path metric at time instant '6'/internal state '00' is '34' and the branch metric from the internal state '00' at time instant '6' to the internal state '00' at time instant '7' is '5', so that the probability of the path results in '39'. On the other hand, as to the path from the internal state '10' at time instant '6', the path metric at time instant '6'/internal state '10' is '29' and the branch metric from the internal state, '10' at time instant '6' to the internal state '00' at time instant '7' is '9', so that the probability of the path results in '38'. Therefore, '38' is assumed as the path metric at time instant '7'/internal state '00', that is, the path from the internal state '10' at time instant '6' to the internal state '00' at time instant '7' is selected. Here, in the diagram, 'x' denotes the discarded path at the merging point.

Then, by tracing the survivor path in the reverse direction of the sequence of the received data, the decoded result can be obtained. However, as understood from this decoded result, when four bits of errors have occurred, a path selection fault occurs from the internal state '10' at time instant '6' to the internal state '00' at time instant '7', hence causes errors in the information sequence, thus making it impossible to obtain the original information sequence.

Figure 18:
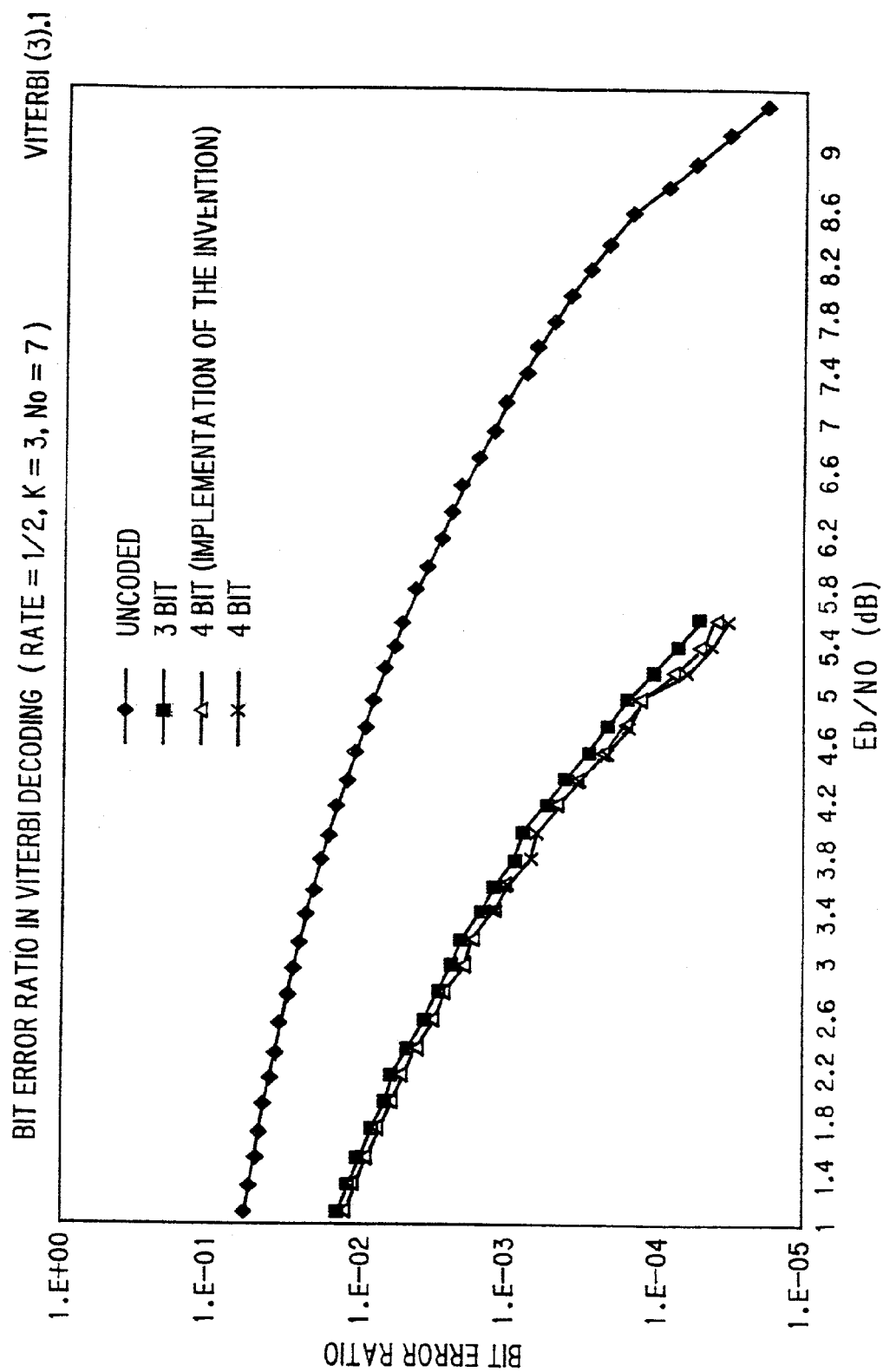
FIG. 18 is a BER characteristic chart showing an example of BER characteristics in the same Viterbi decoder.
Figure 19:
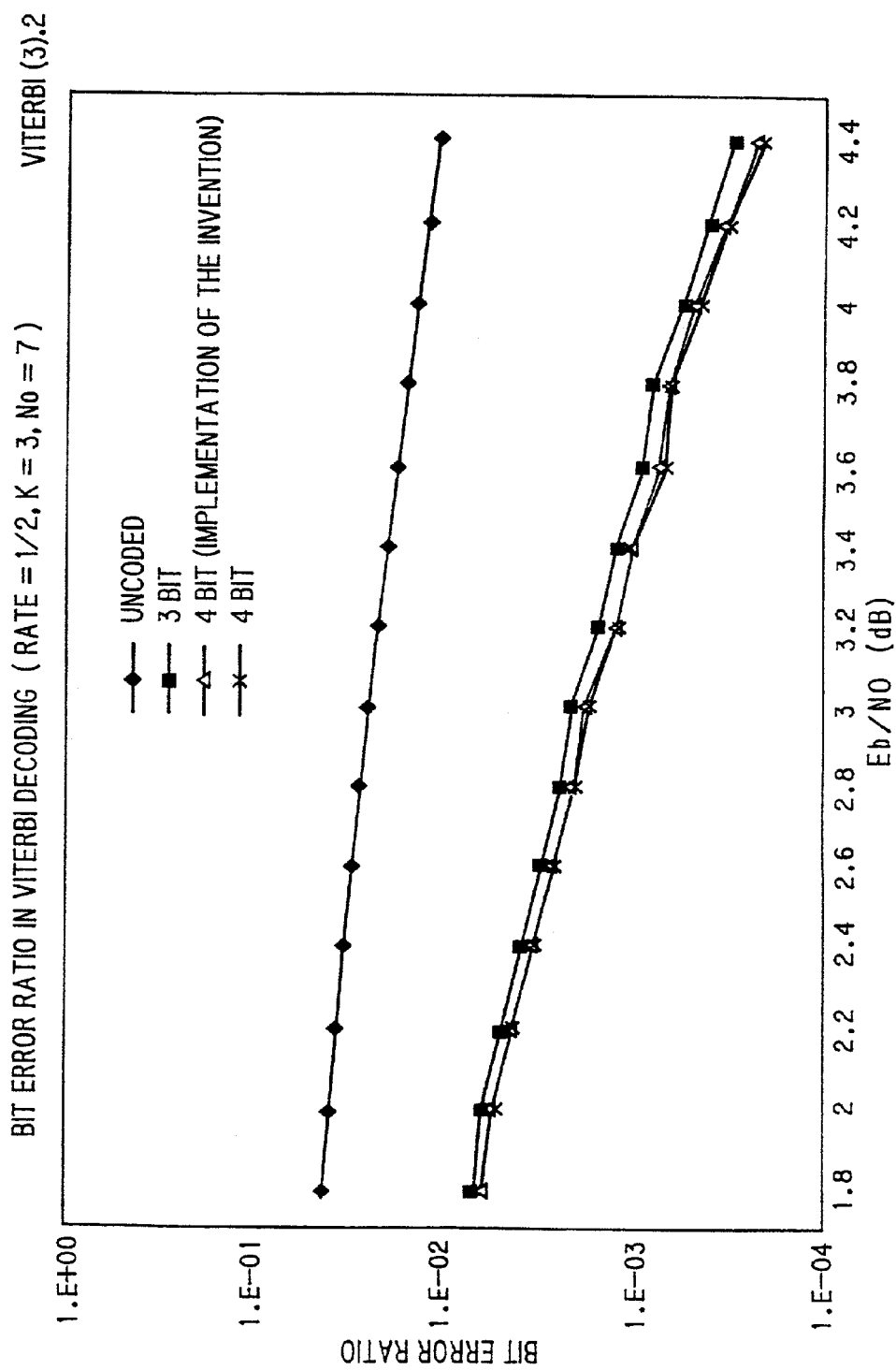
FIG. 19 is a partially enlarged chart of the same BER characteristic chart.

In this way, according to the present embodiment, it is possible to improve error correction characteristics while keeping the number of operational bits in ACS 3 from exceeding '6'. FIG. 18 is a BER characteristic chart showing the bit error ratio (BER) characteristic (with an input bit precision of '4') when the present embodiment is applied, in comparison with the bit error ratio (BER) characteristics (with an input bit precision of '3' and with an input bit precision of '4') of the conventional example. FIG. 19 is a partially enlarged chart of the same chart. As understood from the charts, the embodiment shows some degradation compared to the conventional example wherein full calculation is performed with an input bit precision of '4', but presents some improvement in characteristics compared to the conventional example wherein full calculation is performed with an input bit precision of '3'.

Next, a Viterbi decoder configured as above, with its constraint length set at 9 and coding rate set at 1/3 will be described. The generator polynomials as follows are used:

$$G0=1+D^2+D^3+D^5+D^6+D^7+D^8$$

$$G1=1+D+D^3+D^4+D^7+D^8$$

$$G2=1+D+D^2+D^5+D^8.$$

Figure 20:
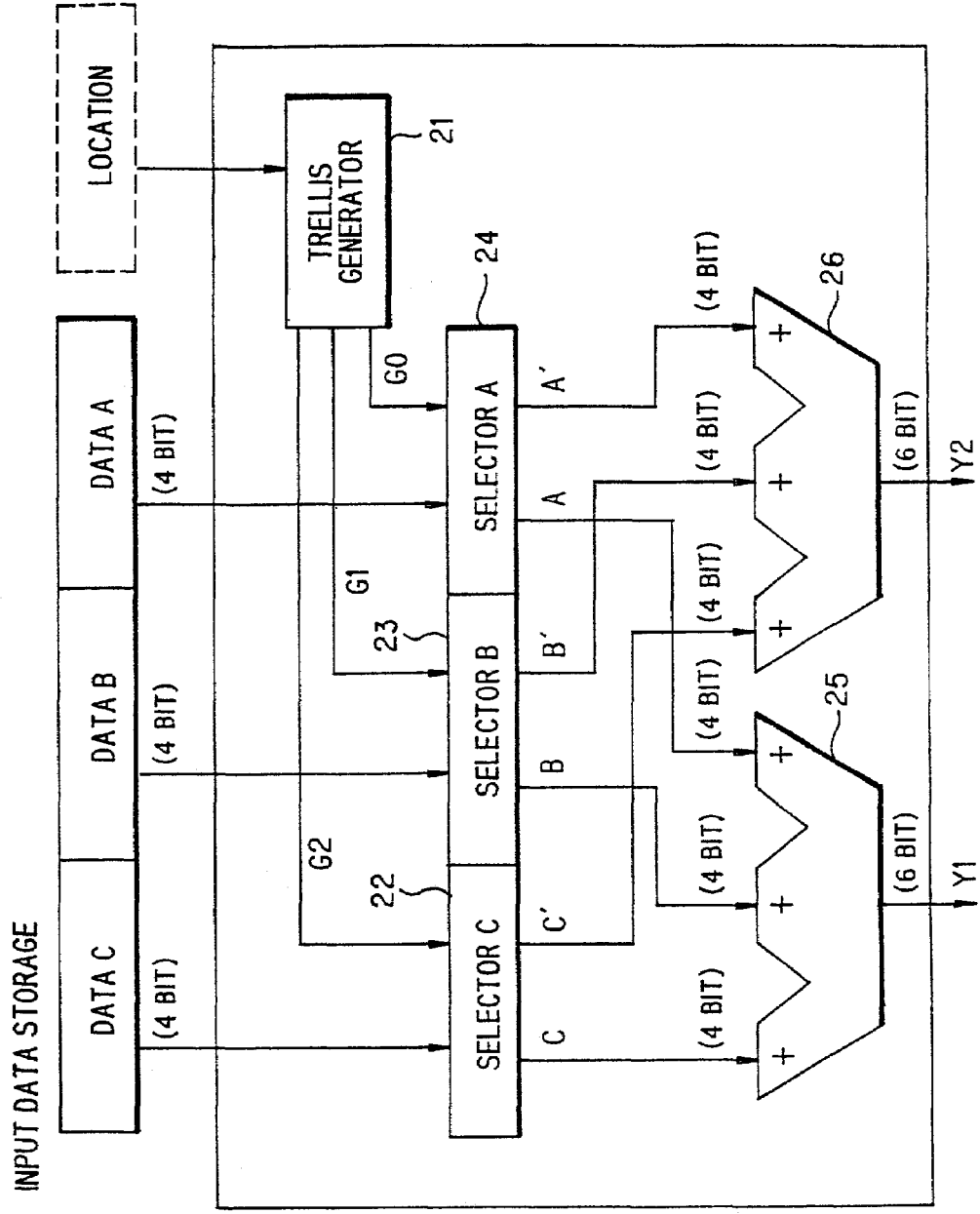
FIG. 20 is a block diagram showing an example of a specific configuration of a branch metric calculator.

FIG. 20 is a constructional example of a branch metric calculator 1 in the Viterbi decoder configured as above. This calculator is comprised of a trellis generator 21, selectors 22, 23 and 24 and 6-bit adders 25 and 26.

Trellis generator 21 is adapted to determine from which information bit, '0' or '1', a metric should be determined. In a calculating example at an internal state '01111000b(=078 h)', for input data '0', $$G0=1+1+1=1$$

$$G1=1+1=0$$

$$G2=1=1.$$

For input data '1', $$G0=1+1+1+1=0$$

$$G1=1+1+1=1$$

$$G2=1+1=0.$$

When G0, G1 and G2 are '0', selectors 22, 23 and 24 use respective metrics corresponding to information bit '0' for the received levels of data A, B and C. When G0, G1 and G2 are '1', the selectors use respective metrics corresponding to information bit '0' for the received levels of data A, B and C. Each output from these selectors 22, 23 and 24 is supplied to adders 25 and 26, where these are summed to output branch metric values Y1 and Y2.

When the input bit precision is set at three bits, the outputs from selectors 22, 23 and 24 range from 0 to 7. Therefore, the range of branch metrics is from 0 to 21 (10101b in binary), and the bit precision needs five bits. When the input bit precision is set at four bits, the outputs from selectors 22, 23 and 24 range from 0 to 15, so that the range of branch metrics is from 0 to 45 (101101b in binary) and the bit precision needs six bits.

Figure 21:
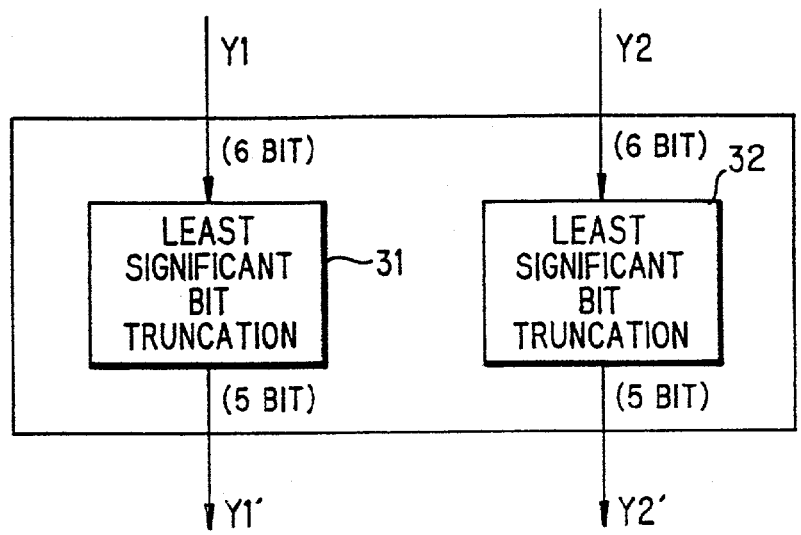
FIG. 21 is a block diagram showing an example of a specific configuration of a bit range converter.

FIG. 21 is a constructional example of a bit range converter 11 in the Viterbi decoder configured as above. This converter is comprised of a least significant bit truncating portions 31 and 32. These least significant bit truncating portions 31 and 32 are adapted to drop the least significant bit of branch metric values Y1 and Y2 output from branch metric calculator 1, so that the values with their least significant bit truncated are output as branch metric values Y1' and Y2' having a bit length which is operable in ACS portion 2. More specifically, for example, when the input bit precision is set at four bits, the branch metric length is set at six bits taking into account the maximum value of the branch metric. Therefore this bit length is truncated into 5 bits as the number of bits which can be operated in ACS portion 2.

Figure 22:
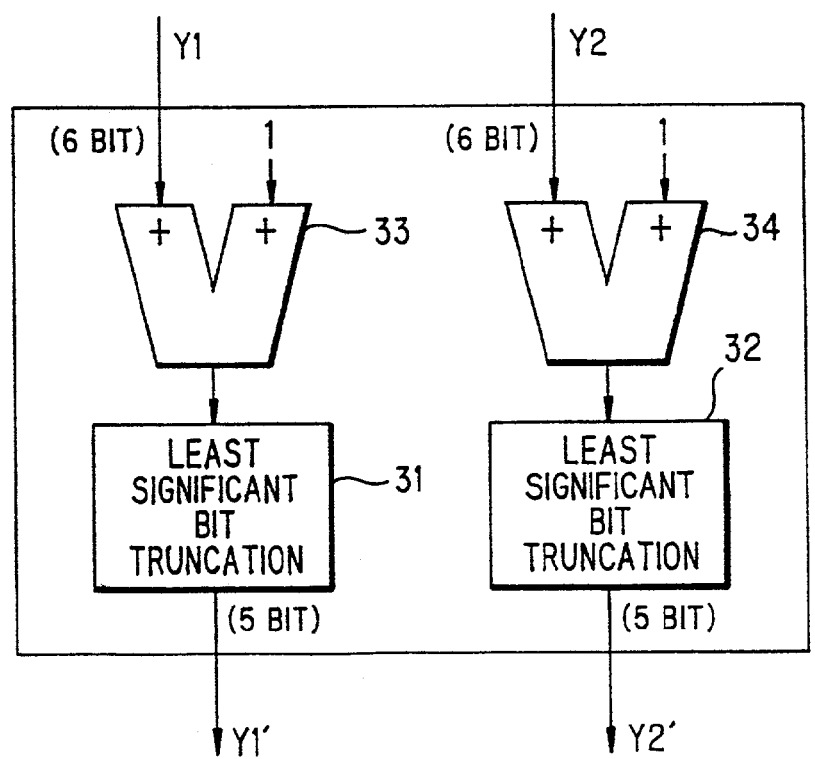
FIG. 22 is a block diagram showing another example of a specific configuration of a bit range converter.

Here, as shown in FIG. 22, it is possible to round the branch metric values Y1 and Y2 output from branch metric calculator 1 by adding '1' to each of them through 6-bit adders 33 and 34 and dropping the least significant bit through the least significant bit truncating portions 31 and 32.

Figure 23:
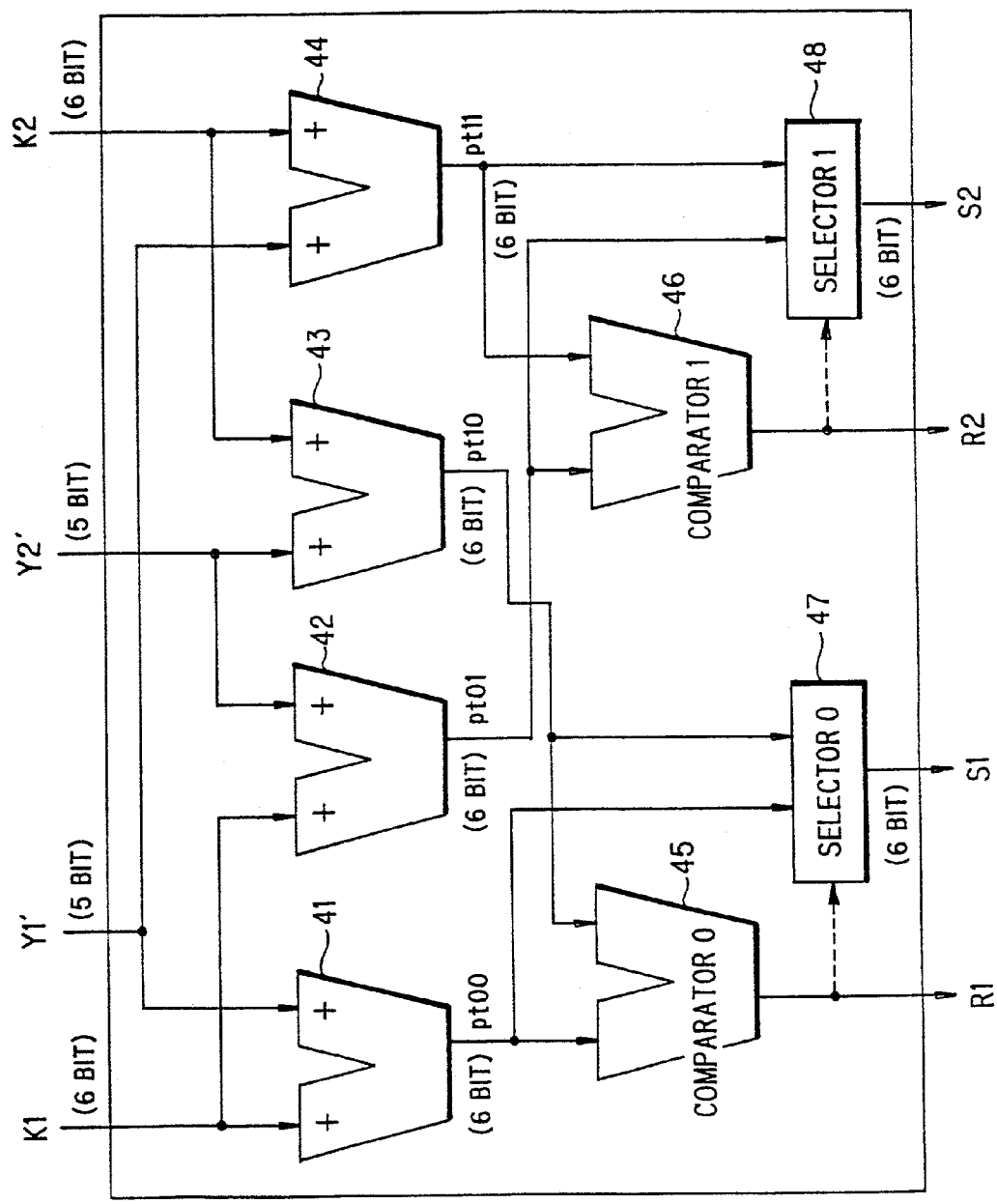
FIG. 23 is a block diagram showing an example of a specific configuration of an ACS portion.

FIG. 23 is a constructional example of an ACS portion 2 in the Viterbi decoder configured as above. This ACS portion is comprised of 6-bit adders 41 to 44, comparators 45 and 46, selectors 47 and 48. Of these, adder 41 sums data K1 from path metric memory 3 and data Y1' from bit range converter 11 to output pt00, adder 42 sums data K1 from path metric memory 3 and data Y2' from bit range converter 11 to output pt01, adder 43 sums data K2 from path metric memory 3 and data Y2' from bit range converter 11 to output pt10, and adder 42 sums data K2 from path metric memory 3 and data Y1' from bit range converter 11 to output pt11.

Comparator 45 compares pt00 and pt10 and outputs the result as the path data value to R1. Selector 47, in accordance with the result from comparator 45, selects pt00 if pt00≦pt10 or selects pt10 if pt00>pt10 to output a new path metric S1. Comparator 46 compares pt01 and pt11 and outputs the result as the path data value to R2. Selector 48, in accordance with the result from comparator 46, selects pt01 if pt01≦pt11 or selects pt11 if pt01>pt11 to output a new path metric S2. Here, these new path metrics S1 and S2 are stored into path metric memory 3.

Figure 24:
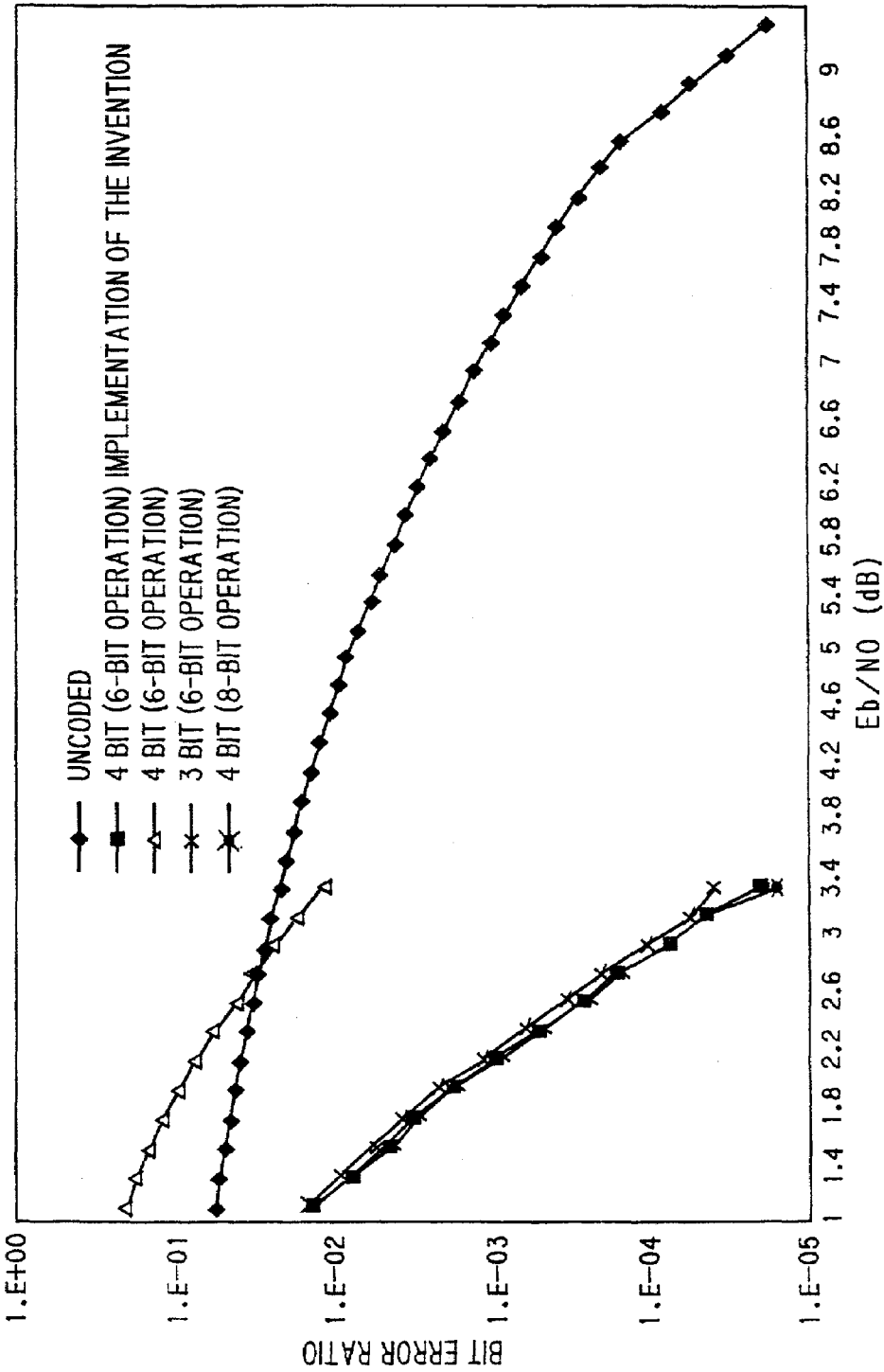
FIG. 24 is a BER characteristic chart showing another example of BER characteristics in the same Viterbi decoder.

When the Viterbi algorithm process is implemented by the above configurational example, the BER characteristic shown in FIG. 24 is obtained. Here, FIG. 24 shows the graphs for an uncoded case, a case with an input bit precision of 3 bits and operational bit length of 6 bits, a case where the present embodiment is employed with an input bit precision of 4 bits and operational bit length of 6 bits, a case where the present embodiment is not employed with an input bit precision of 4 bits and operational bit length of 6 bits and a case where the present embodiment is not employed with an input bit precision of 4 bits and operational bit length of 8 bits. FIG. 25 shows its partially enlarged chart.

As understood from the drawings, the BER characteristic when the present embodiment is employed with an input bit precision of 4 bits or where the branch metric values are converted from 6 bits to 5 bits and internal operations are processed in 6 bits, is more or less inferior to that when the input bit number is set at 4 bits and a large enough number of operational bits are taken or when the branch metric values are directly used with internal operations processed in 8 bits. However, the characteristic can be improved compared to the case where the input bit precision is set at 3 bits and a large enough number of operational bits are taken or where the circuit scale for internal operations is equivalent to the configuration of the embodiment.

As has been described heretofore, according to the invention described in any one of the first through third aspects, since it is possible to improve the bit accuracy of the input data without increasing the number of operational bits for calculating path metrics, it is possible to improve error correction characteristic while suppressing enlargement in system scale.

INDUSTRIAL APPLICABILITY

As has been described, the invention is suitable for a Viterbi decoder which can improve error correction characteristics while suppressing enlargement in system scale.

The invention claimed is:
1. A Viterbi decoder comprising:
a branch metric calculating portion for calculating a branch metric value based on a received sequence;
a bit range converting portion for converting a bit range of the branch metric value calculated by the branch metric calculating portion by truncating a least significant bit of the branch metric value calculated by the branch metric calculating portion;
a path metric calculating portion for calculating a path metric value based on the branch metric value whose bit range has been converted by the bit range converting portion; and
a decoding portion for decoding received codes based on the path metric value calculated by the path metric calculating portion.
2. A method of Viterbi decoding comprising the steps of:
calculating a branch metric value based on a received sequence;
calculating a path metric value based on the branch metric values; and
decoding a received codes based on the path metric value,
the method further comprising:
converting a bit range of the branch metric value by truncating a least significant bit of the branch metric value;
calculating the path metric value based on the branch metric value whose bit range has been converted.

* * * * *